United States Patent
Chapman et al.

(10) Patent No.: US 6,367,046 B1
(45) Date of Patent: Apr. 2, 2002

(54) MULTI-BIT ERROR CORRECTION SYSTEM

(75) Inventors: Ronald James Chapman; Ariel Brent Christensen; Carl Evan Jones; Sushama Mahesh Paranjape, all of Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 08/428,812

(22) Filed: Apr. 24, 1995

Related U.S. Application Data

(63) Continuation of application No. 07/950,842, filed on Sep. 23, 1992.

(51) Int. Cl.[7] .................... H03M 13/00; G06F 11/00
(52) U.S. Cl. ................................ 714/752; 714/801
(58) Field of Search .......................... 371/37.1, 37.7, 371/37.6, 37.2, 49.1, 49.2; 364/737, 738

(56) References Cited

U.S. PATENT DOCUMENTS

| | | | | |
|---|---|---|---|---|
| 3,582,878 A | * | 6/1971 | Bossen et al. | 371/37.2 |
| 3,755,779 A | * | 8/1973 | Price | 371/40.1 |
| 3,825,893 A | * | 7/1974 | Bassen et al. | 371/37.1 |
| 4,077,565 A | * | 3/1978 | Nibby, Jr. et al. | 235/312 |
| 4,345,328 A | * | 8/1982 | White | 371/38 |
| 4,462,102 A | * | 7/1984 | Povlick | 371/49.2 |
| 4,523,314 A | * | 6/1985 | Burns et al. | 371/38 |
| 4,617,664 A | * | 10/1986 | Aichelmann et al. | 371/38 |
| 4,649,540 A | * | 3/1987 | Proebsting | 37/37 |
| 4,785,451 A | * | 11/1988 | Sako et al. | 371/37 |
| 4,882,731 A | * | 11/1989 | Van Gils | 371/37.6 |
| 5,251,219 A | * | 10/1993 | Babb | 371/37.4 |
| 5,418,796 A | * | 5/1995 | Price et al. | 371/37.2 |

* cited by examiner

*Primary Examiner*—Christine T. Tu
(74) *Attorney, Agent, or Firm*—Robert M. Sullivan

(57) ABSTRACT

An improved multi-bit error correction system. The inventive error correcting system performs a fast error correction operation on individual bits within multi-bit modules. In a specific implementation, the invention uses Hamming codes and divides an n times m bit data word into m modules, with each module having n bits. Next, the ith bits of each module are combined to form a set of parity bits. Syndrome bits are generated from the parity bits and used to locate errors in the bits and provide an indication of same. Finally, errors in the bits are corrected in a conventional manner to provide corrected data bits.

7 Claims, 3 Drawing Sheets

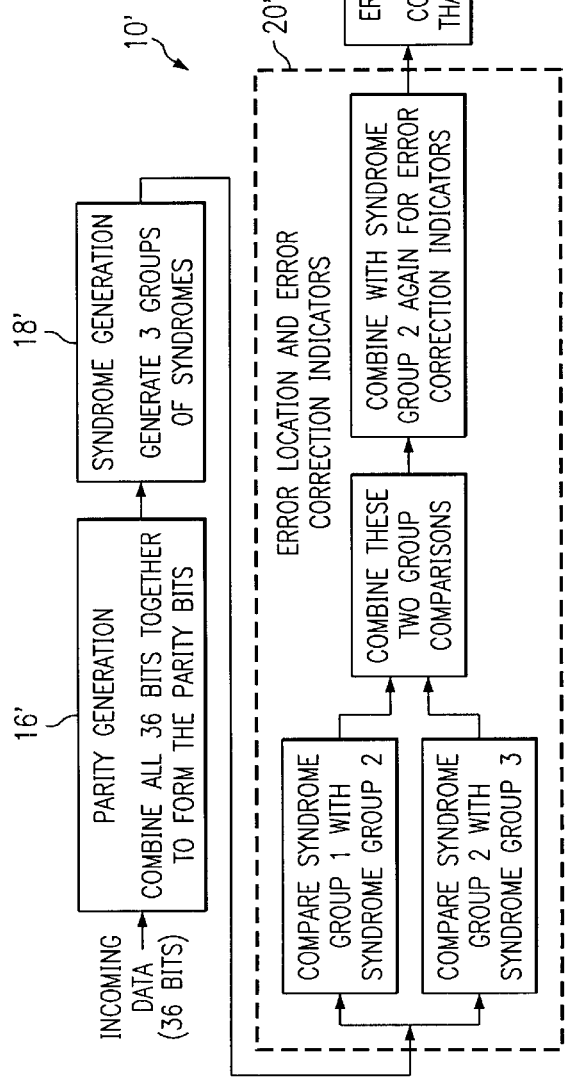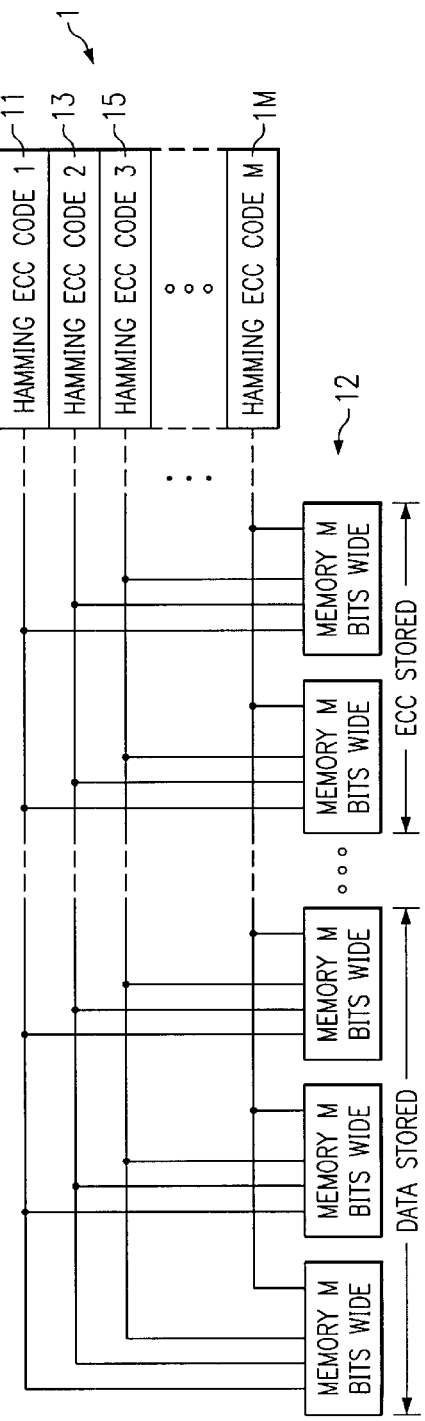

MULTI-BIT ERROR CORRECTION SYSTEM

This is a Continuation of application Ser. No. 07/950,842, filed Sep. 23, 1992.

BACKGROUND OF THE INVENTION

1. Field of the Invention

The present invention relates to digital data communication, processing, storage and retrieval. More specifically, the present invention relates to error detection and correction Systems for digital data communication, processing storage and retrieval systems.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

For certain applications, accurate communication, processing, storage and retrieval of digital data is critically important. For these applications, error detection and correction schemes are employed to detect and, in many cases correct, bit errors in the digital data.

Originally, data was stored in one bit modules in memory allowing for the use of Hamming codes for data error detection and correction. Hamming codes were relatively simple, using stored parity over certain bits to determine which bit, if any, was in error. As memories grew larger, data was more often stored in larger (e.g. four bit) modules to minimize parts count, power consumption, cost and other factors associated with the design, manufacture and operation of the data communication, processing, storage and/or retrieval system. Thus, instead of storing data in a memory one bit wide and 256 rows deep, memory might be stored four bits wide and 256 rows deep.

For the multiple bit module, new and more powerful data error detection and correction schemes were required over any or all bits of a single module. For this purpose, the Reed-Solomon codes were found particularly well suited for providing multi-bit correction up to the width of an entire module.

Unfortunately, for the demands of many current applications, Reed-Solomon codes have been found to be too slow. Accordingly, a need remains in the art for a faster error detection and correction system for multiple bit modules in digital data communication, processing, storage and retrieval systems.

SUMMARY OF THE INVENTION

The need in the art is addressed by the present invention which provides fin improved multi-bit error correction system. The inventive error correcting system performs a fast error correcting operation on individual bits within multi-bit modules. In a specific implementation, the invention uses a Hamming code and divides an n times m bit data word into n modules, with each module having m bits. Next, the ith bits of each module are combined to form a set of parity bits. Syndrome bits are generated from the parity bits and used to locate errors in the bits and provide an indication of same. Finally, errors in the bits are corrected in a conventional manner to provide corrected data bits.

The invention therefore provides high speed error detection and correction for multiple bit modules in digital data communication, processing, storage and retrieval systems.

BRIEF DESCRIPTION OF THE DRAWINGS

FIG. 3 is a block diagram of a typical Reed-Solomon error correcting code decoder.

FIG. 4 is a block diagram of the error correcting system of the present invention showing the use of multiple Hamming code decoders.

DESCRIPTION OF THE INVENTION

Illustrative embodiments and exemplary applications will now be described with reference to the accompanying drawings to disclose the advantageous teachings of the present invention.

Figure 1:
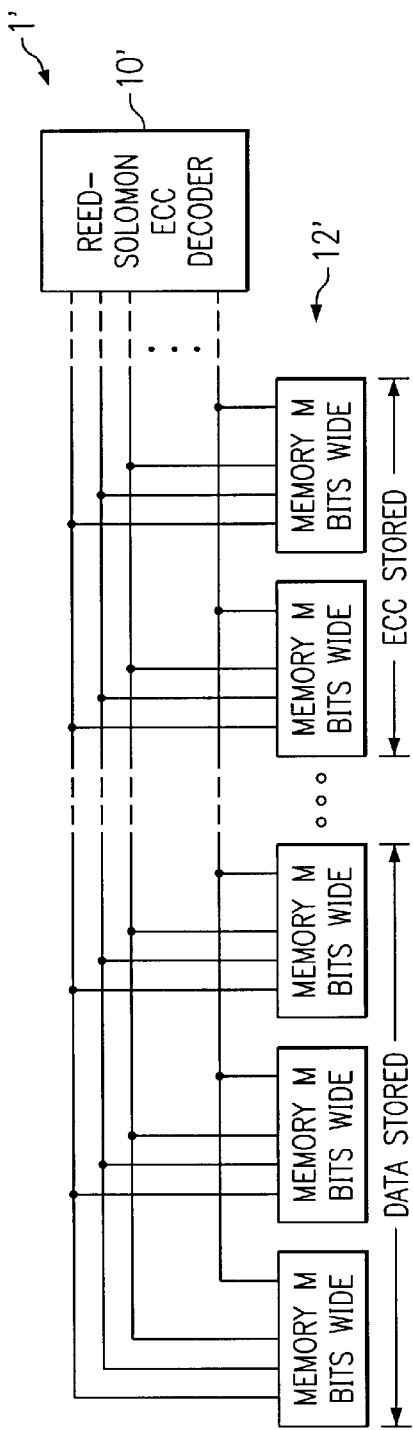
FIG. 1 is a block diagram of a conventional error correcting system with a Reed-Solomon error correcting code decoder and memory.

FIG. 1 is a block diagram of a conventional error correcting system 1' with an error correcting code decoder 10' and memory 12'. The decoder 10' is shown as a Reed-Solomon decoder. Note that the Reed-Solomon decoder handles all of the data in a digital word at one time. This is illustrated with reference to FIGS. 2 and 3 below.

Figure 2:
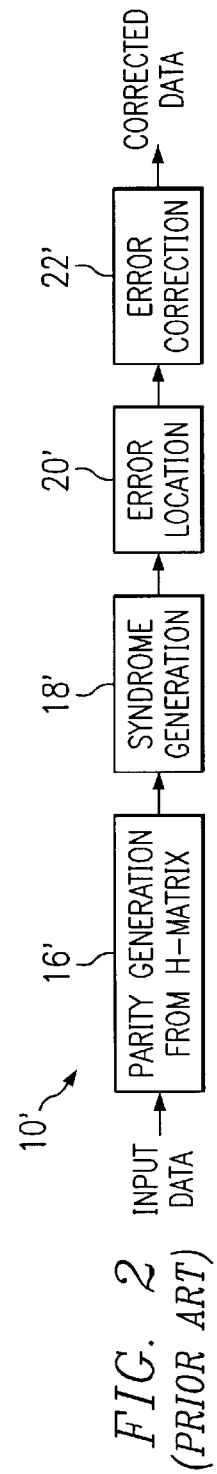
FIG. 2 is a simplified block diagram of a typical error correcting code decoder.

FIG. 2 is a simplified block diagram of a typical error correcting code decoder 10'. The decoder 10' includes a parity generation circuit 16', a syndrome generator 18', an error locator 20' and an error corrector 22'.

If the decoder 10' is a Reed-Solomon decoder, it may operate as shown in FIG. 3. For a 36 bit data word, the parity generator 16' is an array of exclusive OR gates which combines all 36 bits together to form parity bits. The syndrome generator 18' is also typically implemented with exclusive OR gates and compares the generated parity bits with stored parity (check) bits to generate 3 groups of syndromes. The error location circuit 20' is typically implemented with exclusive OR gates and other logic gates (AND and OR gates) which compare syndrome group 1 with syndrome group 2 and syndrome group 2 with syndrome group 3. Next these two group comparisons are combined and the resulting combination is combined with syndrome group two again for error correction location indication. Finally, the data bits in error are corrected by the error corrector circuit 22' which is also typically implemented with exclusive OR gates. The Reed-Solomon parity equations are shown below:

$P(00) = D(31) \oplus D(28) \oplus D(25) \oplus D(22) \oplus D(19) \oplus D(12) \oplus D(9) \oplus D(8) \oplus D(6) \oplus D(5) \oplus D(4) \oplus D(3) \oplus D(2) \oplus D(1) \oplus D(0))$ $P(01) = D(31) \oplus D(29) \oplus D(28) \oplus D(26) \oplus D(25) \oplus D(23) \oplus D(22) \oplus D(19) \oplus D(16) \oplus D(13) \oplus D(10) \oplus D(7) \oplus D(0))$ $P(02) = D(30) \oplus D(29) \oplus D(27) \oplus D(26) \oplus D(23) \oplus D(20) \oplus D(17) \oplus D(14) \oplus D(11) \oplus D(4) \oplus D(1))$ $P(03) = D(31) \oplus D(30) \oplus D(27) \oplus D(24) \oplus D(21) \oplus D(18) \oplus D(15) \oplus D(8) \oplus D(5) \oplus D(4) \oplus D(2) \oplus D(1) \oplus D(0))$ $P(04) = D(28) \oplus D(24) \oplus D(20) \oplus D(16) \oplus D(12) \oplus D(8) \oplus D(4) \oplus D(0))$ $P(05) = D(29) \oplus D(25) \oplus D(21) \oplus D(17) \oplus D(13) \oplus D(9) \oplus D(5) \oplus D(1))$ $P(06) = D(30) \oplus D(26) \oplus D(22) \oplus D(18) \oplus D(14) \oplus D(10) \oplus D(6) \oplus D(2))$ $P(07) = D(31) \oplus D(27) \oplus D(23) \oplus D(19) \oplus D(15) \oplus D(11) \oplus D(7) \oplus D(3))$ $P(08) =$
$D(31) \oplus D(30) \oplus D(29) \oplus D(27) \oplus D(26) \oplus D(25) \oplus D(24) \oplus D(22)$
$\oplus D(21) \oplus D(20) \oplus D(17) \oplus D(16) \oplus D(12) \oplus D(11) \oplus D(6) \oplus D(1))$ $P(09) = D(29) \oplus D(28) \oplus D(24) \oplus D(23) \oplus D(18) \oplus D(13) \oplus D(11) \oplus D(8)$
$\oplus D(7) \oplus D(6) \oplus D(2) \oplus D(1))$ $P(10) =$
$D(30) \oplus D(29) \oplus D(28) \oplus D(25) \oplus D(24) \oplus D(20) \oplus D(19) \oplus D(14)$
$\oplus D(9) \oplus D(7) \oplus D(4) \oplus D(3) \oplus D(2))$ $D(11) =$
$D(31) \oplus D(30) \oplus D(29) \oplus D(28) \oplus D(26) \oplus D(25) \oplus D(24) \oplus D(21)$
$\oplus D(20) \oplus D(16) \oplus D(15) \oplus D(10) \oplus D(5) \oplus D(3) \oplus D(0))$ Note: P(x) are the Parity bits, D(x) are the incoming data bits and $\oplus$ indicates an exclusive OR function.

The Reed-Solomon error location equations for bits 31–28 are shown below:

$EL(31\text{-}28) = ((P(7) \oplus P'(7) \oplus P(11) \oplus P'(11) \oplus P(10) \oplus P'(10))\text{OR}$ $(P(6) \oplus P'(6) \oplus P(10) \oplus P'(10) \oplus P(1) \oplus P'(1))\text{OR}$ $(P(5) \oplus P'(5) \oplus P(11) \oplus P'(11) \oplus P(9) \oplus P'(9) \oplus P(8) \oplus P'(8))\text{OR}$ $(P(4) \oplus P'(4) \oplus P(11) \oplus P'(11) \oplus P(0) \oplus P'(0)))$

AND $((P(3) \oplus P'(3) \oplus P(7) \oplus P'(7) \oplus P(6) \oplus P'(6))\text{OR}$ $(P(2) \oplus P'(2) \oplus P(6) \oplus P'(6) \oplus P(5) \oplus P'(5))\text{OR}$ $(P(1) \oplus P'(1) \oplus P(7) \oplus P'(7) \oplus P(5) \oplus P'(5) \oplus P(4) \oplus P'(4))\text{OR}$ $(P(0) \oplus P'(0) \oplus P(7) \oplus P'(7) \oplus P(4) \oplus P'(4)))$ $EC(31) = (P(7) \oplus P'(7)) \text{ AND } EL(31\text{-}28)$ $EC(30) = (P(6) \oplus P'(6)) \text{ AND } EL(31\text{-}28)$ $EC(29) = (P(5) \oplus P'(5)) \text{ AND } EL(31\text{-}28)$ $EC(28) = (P(4) \oplus P'(4)) \text{ AND } EL(31\text{-}28)$ Note: EL(x) are the Error Location Indicators, EC(x) are the Error Correction Indicators, P(x) are the calculated parity bits, P'(x) are the incoming parity bits and $\oplus$ indicates an exclusive OR function.

There are similar equations for each memory module.

Reed-Solomon parity generation requires several data bits to be combined together. These wide equations cause the parity generation logic to have relatively large delays. The error location equations similarly have many terms. To implement each of these functions in current technologies, where typical gate width is limited to 2 to 5 inputs, creates paths of propagation delay that are very large. Hence, package correction is accomplished at the cost of memory speed.

For example, the levels of logic required for the typical conventional Reed-Solomon decoder is shown below in Table I:

TABLE I

| LEVELS OF LOGIC REQUIRED FOR | DECODER TYPE | |
|---|---|---|
| | REED-SOLOMON | MULTIPLE-HAMMING |
| Parity Generation | 3 | 2 |
| Syndrome Generation | 1 | 1 |
| Error Location | 6 | 2 |
| Error Correction | 1 | 1 |
| TOTAL LOGIC LEVELS | 11 | 6 |

The 11 level logic of the Reed-Solomon decoder typically amounts to a total delay in complementary metal-oxide semiconductor (CMOS) technology of 27 nanoseconds.

As mentioned above, for many current applications, there is a need for a faster error detecting and correcting system. As described more fully below, the multiple Hamming code decoder of the present invention can perform error correction on the same data as the Reed-Solomon decoder with 6 logic levels and a typical delay of 15 nanoseconds in CMOS technology.

FIG. 4 is a block diagram of an illustrative embodiment of the error correcting system of the present invention showing the use of multiple Hamming code decoders. The illustrative error correcting system 1 includes a multiple Hamming code decoder 10 consisting of M individual identical Hamming error correcting code decoders 11, 13, 15 . . . and 1M, one for each of m bits of memory in each of n modules of memory storing an n times m bit digital data word. As with the conventional Reed-Solomon decoder, the error correcting codes bits are stored together in modules separate from the locations where data is stored. As discussed more fully below, by using several identical simple fast Hamming code decoders to operate on single bits of data, a higher throughput of data may be achieved.

Figure 5:
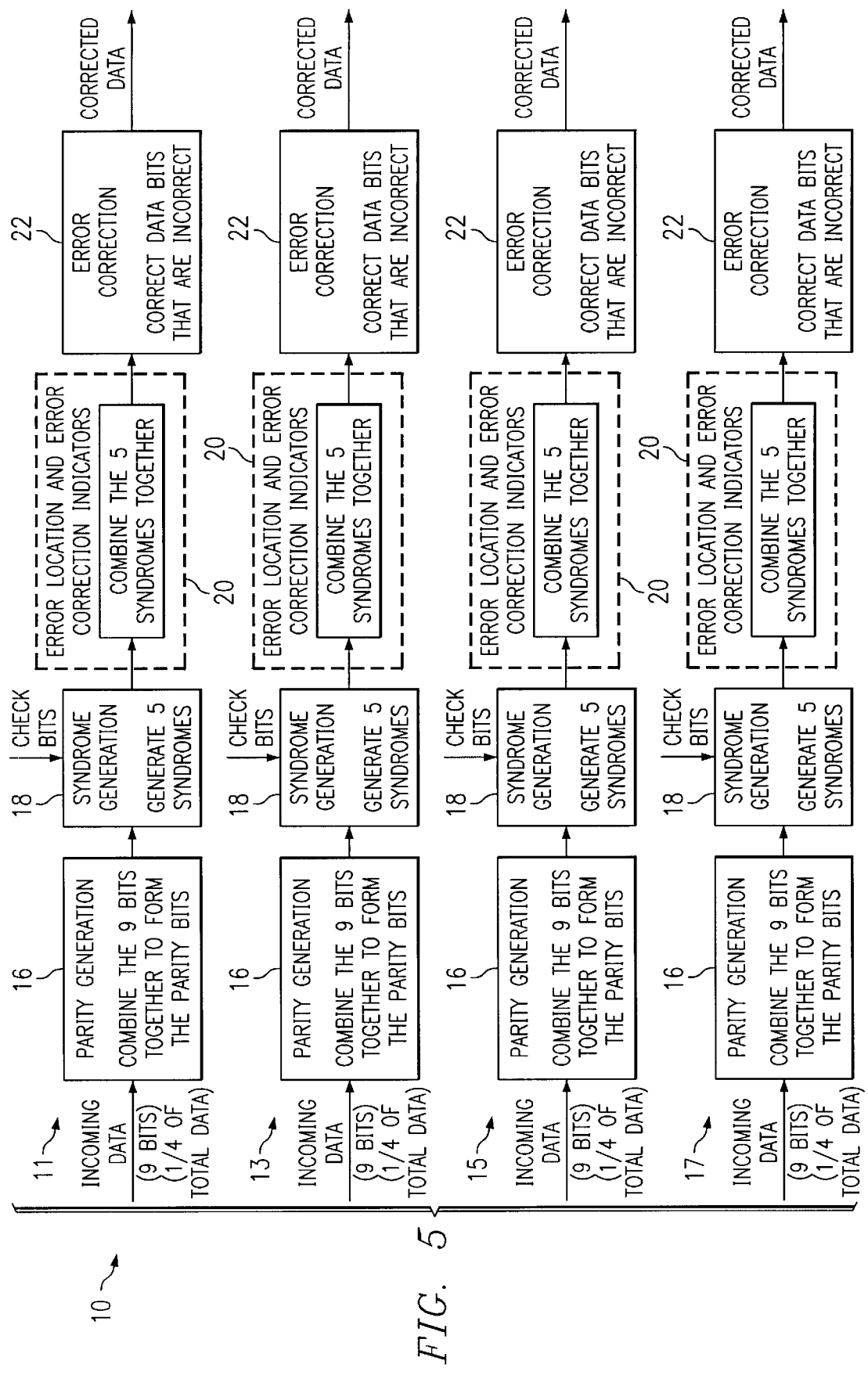
FIG. 5 is a block diagram of a multiple Hamming code decoder constructed in accordance with the present teachings.

FIG. 5 is a block diagram of a multiple Hamming code decoder 10 constructed in accordance with the present Teachings. The data is provided to the decoders in a 'bit-slice' manner n times, m bits at a time, and divided into n m-bit modules. There is one decoder for each bit in a module. Thus, for a 36 bit word divided into nine modules of four bits each, n=9, m=4 and 4 individual Hamming code decoders are provided for parallel processing of each bit in the module. The ith bit of each module is presented to the ith decoder where i varies from 1 to m, Thus, the 1st bit of each module is input to the first decoder 11, the 2nd bit of each module is input to the second decoder 13, the third bit of each module is input to the third decoder 15 and so on. With nine modules in tie illustrative embodiment, 9 bits of data are presented for error correction.

The parity generator 16 of each decoder combines the 9 bits together to form parity bits using exclusive OR gates in accordance with the multiple Hamming code parity equations shown below:

$P(19) = D(35) \oplus D(23) \oplus D(15) \oplus D(11) \oplus D(3)$    ECC Code 1

$P(18) = D(34) \oplus D(22) \oplus D(14) \oplus D(10) \oplus D(2)$    ECC Code 2

$P(17) = D(33) \oplus D(21) \oplus D(13) \oplus D(9) \oplus D(1)$    ECC Code 3

$P(16) = D(32) \oplus D(20) \oplus D(12) \oplus D(8) \oplus D(0)$    ECC Code 4

$P(15) = D(27) \oplus D(23) \oplus D(19) \oplus D(11) \oplus D(7) \oplus D(3)$    ECC Code 1

$P(14) = D(26) \oplus D(22) \oplus D(18) \oplus D(10) \oplus D(6) \oplus D(2)$    ECC Code 2

-continued $P(13) = D(25) \oplus D(21) \oplus D(17) \oplus D(9) \oplus D(5) \oplus D(1)$  ECC Code 3

$P(12) = D(24) \oplus D(20) \oplus D(16) \oplus D(8) \oplus D(4) \oplus D(0)$  ECC Code 4

$P(11) = D(35) \oplus D(31) \oplus D(27) \oplus D(23) \oplus D(15) \oplus D(7)$  ECC Code 1

$P(10) = D(34) \oplus D(30) \oplus D(26) \oplus D(22) \oplus D(14) \oplus D(6)$  ECC Code 2

$P(09) = D(33) \oplus D(29) \oplus D(25) \oplus D(21) \oplus D(13) \oplus D(5)$  ECC Code 3

$P(08) = D(32) \oplus D(28) \oplus D(24) \oplus D(20) \oplus D(12) \oplus D(4)$  ECC Code 4

$P(07) = D(31) \oplus D(27) \oplus D(19) \oplus D(15) \oplus D(11)$  ECC Code 1

$P(06) = D(30) \oplus D(26) \oplus D(18) \oplus D(14) \oplus D(10)$  ECC Code 2

$P(05) = D(29) \oplus D(25) \oplus D(17) \oplus D(13) \oplus D(9)$  ECC Code 3

$P(04) = D(28) \oplus D(24) \oplus D(16) \oplus D(12) \oplus D(8)$  ECC Code 4

$P(03) = D(35) \oplus D(31) \oplus D(19) \oplus D(7) \oplus D(3)$  ECC Code 1

$P(02) = D(34) \oplus D(30) \oplus D(18) \oplus D(6) \oplus D(2)$  ECC Code 2

$P(01) = D(33) \oplus D(29) \oplus D(17) \oplus D(5) \oplus D(1)$  ECC Code 3

$P(00) = D(32) \oplus D(28) \oplus D(16) \oplus D(4) \oplus D(0)$  ECC Code 4

Note: P(x) are the Parity bits, D(x) are the incoming data bits and $\oplus$ indicates an exclusive OR function.

Each syndrome generator 18 then generates 5 syndromes (in the example) using error correcting code (ECC) checkbits stored and retrieved wish the data from memory in accordance with the same bit slice scheme. The syndromes are combined logically to locate errors by an error location and correction indication circuit 20. The error location and correction indication circuit 20 is implemented with exclusive OR gates and logic gates in accordance with the equations below.

The multiple Hamming code error location equation for bits 31–28 are shown below:

$EC(31) = (P(19) \oplus P'(19))$ AND $(P(15) \oplus P'(15))$ AND $(P(11) \oplus P'(11))$ AND $(P(7) \oplus P'(7))$ AND $(P(3) \oplus P'(3))$ $EC(30) = (P(18) \oplus P'(18))$ AND $(P(14) \oplus P'(14))$ AND $(P(10) \oplus P'(10))$ AND $(P(6) \oplus P'(6))$ AND $(P(2) \oplus P'(2))$ $EC(29) = (P(17) \oplus P'(17))$ AND $(P(13) \oplus P'(13))$ AND $(P(9) \oplus P'(9))$ AND $(P(5) \oplus P'(5))$ AND $(P(1) \oplus P'(1))$ $EC(28) = (P(16) \oplus P'(16))$ AND $(P(12) \oplus P'(12))$ AND $(P(8) \oplus P'(8))$ AND $(P(4) \oplus P'(4))$ AND -continued $(P(0) \oplus P'(0))$ Note: EC(x) are the Error Correction Indicators, P(x) are the calculated parity bits, P'(x) are the incoming parity bits and $\oplus$ indicates an exclusive OR function.

The EL and EC equations from the Reed-Solomon are combined in the equations for EC in the multiple Hamming codes.

There are similar equations for each memory module.

The erroneous bits are corrected by a conventional error correcting circuit 22 to provide the corrected data bits.

Those skilled in the art will appreciate that the multiple Hamming code decoder system of the present invention limits the parity equation depth to 6 terms and limits the error location terms to 5. As illustrated in Table I above, the parity generation terms can be implemented in current technologies with a maximum of two levels of gate delay while the error location terms can be implemented in one to two levels of gate delay, depending on whether input gates with sufficiently wide fan-in are available. In any event, the result is a correction scheme that is very fast compared with the Reed-Solomon approach while offering the same correction capabilities.

Thus, the present invention has been described herein with reference to a particular embodiment for a particular application. Those having ordinary skill in the art and access to the present teachings will recognize additional modifications, applications and embodiments within the scope thereof. For example, the invention is not limited to use with Hamming codes. Other codes may be used for the purpose as well. In addition, the present teachings may be used in a system in which memory words are divided into groups greater than a single bit and Reed-Solomon codes, for example, as used for the error correction.

It is therefore intended by the appended claims to cover any and all such applications, modifications and embodiments within the scope of the present invention.

Accordingly,

What is claimed is:

1. An improved multi-bit error correction system for correcting an n times m bit data word, said correction system comprising:

first means for dividing said n times m bit data word into m modules, each module having n bits;

second parity generation means for combining the ith bit of each module to form a set of parity bits;

third syndrome generation means for generating a number of syndrome bits from said parity bits;

fourth means responsive to said syndrome generation means for locating multiple errors in said bits in said data word in accordance with a Hamming error detecting and correcting code and providing an indication of said located errors; and fifth means, including m parallel one bit decoders, for correcting said multiple errors in said bits in said data word in accordance with said Hamming error detecting and correcting code to provide corrected data bits.

2. The invention of claim 1 wherein said parity generation means includes m parity generators.

3. The invention of claim 2 wherein each parity generator combines n bits to form a number of parity bits.

4. A method for correcting errors in an n times m bit data word including the steps of:

dividing said n times m bit data word into m modules, each module having n bits;

combining the ith bit of each module to form a set of parity bits;

generating a number of syndrome bits from said parity bits;

using said syndrome bits to locate multiple errors in said bits in said data word in accordance with a Hamming error detecting and correcting code and provide an indication of said located errors; and correcting said multiple errors in said bits in accordance with said Hamming error detecting and correcting code to provide corrected data bits.

5. An improved multi-bit error correction system for correcting an n times m bit data word, said correction system comprising:

first means for dividing said n times m bit data word into m modules, each module having n bits;

second means for detecting multiple errors in each of said modules in accordance with a Hamming error detecting and correcting code; and third means, including m parallel one bit decoders, for correcting multiple errors in each of said modules in accordance with said Hamming error detecting and correcting code.

6. The invention of claim 5 wherein said second means comprises a plurality of parity bits generators.

7. The invention of claim 6 wherein said second means further comprises a plurality of syndrome generators.

* * * * *